US008617650B2

(12) United States Patent
Wang et al.

(10) Patent No.: US 8,617,650 B2
(45) Date of Patent: Dec. 31, 2013

(54) SYNTHESIS OF ALIGNED CARBON NANOTUBES ON DOUBLE-SIDED METALLIC SUBSTRATE BY CHEMICAL VAPOR DEPOSITON

(75) Inventors: Huan Wang, Hong Kong (CN); Ka Ming Ng, Hong Kong (CN); Xijun Hu, Hong Kong (CN); Jiyun Feng, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 1532 days.

(21) Appl. No.: 11/905,241

(22) Filed: Sep. 28, 2007

(65) Prior Publication Data

US 2008/0083612 A1    Apr. 10, 2008

Related U.S. Application Data

(60) Provisional application No. 60/847,597, filed on Sep. 28, 2006.

(51) Int. Cl.
*C23C 16/26* (2006.01)
*C23C 14/34* (2006.01)

(52) U.S. Cl.
USPC ................................. 427/249.1; 204/192.15

(58) Field of Classification Search
USPC ........ 204/192.15; 422/150; 427/248.1, 249.1; 428/408
See application file for complete search history.

(56) References Cited

U.S. PATENT DOCUMENTS

| 6,129,901 | A | 10/2000 | Moskovits et al. |
| 6,350,488 | B1 | 2/2002 | Lee et al. |
| 6,855,231 | B2 | 2/2005 | Kajiura et al. |
| 6,863,942 | B2 | 3/2005 | Ren et al. |
| 7,157,068 | B2 | 1/2007 | Li et al. |
| 7,488,455 | B2 * | 2/2009 | Dai et al. ...................... 422/150 |
| 7,578,909 | B2 * | 8/2009 | Mano et al. .............. 204/192.15 |
| 7,799,163 | B1 * | 9/2010 | Mau et al. ..................... 156/247 |
| 2001/0009693 | A1 | 7/2001 | Lee et al. |
| 2002/0160111 | A1 * | 10/2002 | Sun et al. ................... 427/248.1 |
| 2003/0004058 | A1 | 1/2003 | Li et al. |

(Continued)

FOREIGN PATENT DOCUMENTS

| EP | 1061041 A1 | 12/2000 |
| EP | 1072693 A1 | 1/2001 |

(Continued)

OTHER PUBLICATIONS

Hata, Kenji; Futaba, Don N.; Mizuno, Kohei; Namai, Tatsunori; Yumura, Motoo; Iijima, Sumio. Water-Assisted Highly Efficient Synthesis of Impurity-Free Single-Walled Carbon Nanotubes. Science. (Nov. 19, 2004). vol. 306. 1362-1364.

(Continued)

*Primary Examiner* — Bret Chen
(74) *Attorney, Agent, or Firm* — Nath, Goldberg & Meyer; Jerald L. Meyer; Stanley N. Protigal

(57) ABSTRACT

Aligned multi-walled carbon nanotubes were grown on both sides of a metallic or metal-coated substrate by water vapor-assisted chemical vapor deposition. Aligned carbon nanotube films of thickness ranging from 1 μm to over 100 μm were obtained. By manipulating various operating factors—position of substrate in the reactor, amount of water vapor, amount of catalyst, reactor temperature, and growth time, the morphology and thickness of these carbon nanotube films could be adjusted.

25 Claims, 9 Drawing Sheets

(56) References Cited

U.S. PATENT DOCUMENTS

| | | | |
|---|---|---|---|
| 2004/0266063 A1 | 12/2004 | Montgomery et al. | |
| 2005/0061496 A1 | 3/2005 | Matabayas | |
| 2005/0244327 A9 | 11/2005 | Smalley et al. | |
| 2005/0255304 A1 | 11/2005 | Brink | |
| 2006/0054490 A1 | 3/2006 | Montgomery et al. | |
| 2006/0073089 A1* | 4/2006 | Ajayan et al. | 423/447.2 |
| 2006/0131163 A1* | 6/2006 | Mei et al. | 204/228.8 |
| 2006/0163622 A1 | 7/2006 | Montgomery et al. | |
| 2006/0198956 A1* | 9/2006 | Eres | 427/249.1 |
| 2007/0116957 A1* | 5/2007 | Pan et al. | 428/408 |
| 2008/0199389 A1* | 8/2008 | Chiu et al. | 423/447.3 |
| 2009/0297846 A1* | 12/2009 | Hata et al. | 428/367 |
| 2010/0323207 A1* | 12/2010 | Pinault et al. | 428/446 |
| 2012/0251432 A1* | 10/2012 | Cooper et al. | 423/447.3 |

FOREIGN PATENT DOCUMENTS

| | | |
|---|---|---|
| EP | 1190987 A1 | 3/2002 |
| WO | WO93/24558 A1 | 12/1993 |
| WO | WO 2005054123 A1 * | 6/2005 |

OTHER PUBLICATIONS

Zhu, Lingbo; Xiu, Yonghao; Hess, Dennis W.; Wong, Ching-Ping. Aligned Carbon Nanotube Stacks by Water-Assisted Selective Etching. Nano Leters. (Nov. 2, 2005) vol. 5, No. 12, 2641-2645.

Berber, Savas; Kwon, Young-Kyun; Tomanek, David. Unusually High Thermal Conductivity of Carbon Nanotubes. Physical Review Letters. (May 15, 2000). vol. 84, No. 20, 4613-4616.

Kim, P.; Shi, L.; McEuen, P.L. Thermal Transport Measurements of Individual Multiwalled Nanotubes. Physical Review Letters. (Nov. 19, 2001). vol. 87, No. 21, 215502-1-4.

Liu, C.H.; Huang, H.; Wu, Y.; Fan, S.S. Thermal Conductivity Improvement of Silicone Elastomer with Carbon Nanotube Loading. Applied Physics Letters. (May 24, 2004). vol. 84, No. 21, 4248-4250.

Huang, Hua; Liu, Changhong; Wu, Yang; Fan, Shoushan. Aligned Carbon Nanotube Composite Films for Thermal Management. Advanced Materials. (2005). 17, 1652-1656.

Zhang, K.; Yuen, Matthew M.F.; Wang, N.; Miao, J.Y.; Xiao, David G.W.; Fan, H.B. Thermal Interface Material with Aligned CNT and Its Application in HB-LED Packaging. Electronic Components and Technology Conference. (2006) 177-182.

Zhang, Hongrui; Liang, Erjun; Ding, Pei; Chao, Mingju. Layered Growth of Aligned Carbon Nanotube Arrays by Pyrolysis. Physica B. (2003) 337, 10-16.

Xu, Jun; Fisher, T.S. Enhanced Thermal Contact Conductance Using Carbon Nanotube Arrays. 2004 Inter Society Conference on Thermal Phenomena. 549-555.

Vander Wal, Randall L; Hall, Lee J.; Berger, Gordon M. Optimization of Flame Synthesis for Carbon Nanotubes Using Supported Catalyst. J. Phys. Chem. B 2002, 106, 13122-13132.

Merchan-Merchan, Wilson; Saveliev, Alexei V.; Kennedy, Lawrence A.; High-rate flame synthesis of vertically aligned carbon nanotubes using electric field control. Carbon 42 (2004) 599-608.

Srivastava, Anchal; Srivastava, A.K.; Srivastava, O.N. Curious aligned growth of carbon nanotubes under applied electric field. Carbon 39 (2001) 201-206.

Lee, Ki-Hong; Cho, Jeong-Min; Sigmunda, Wolfgang. Control of growth orientation for carbon nanotubes. Applied Physics Letters 82, 3 Jan. 20, 2003.

Ural, Ant; Li, Yiming; Daia, Hongjie. Electric-field-aligned growth of single-walled carbon nanotubes on surfaces. Applied Physics Letters 81, 18 Oct. 28, 2002.

Okabe, K. Shiraishi, S.; Oya, A.. Mechanism of heterogeneous graphitization observed in phenolic resin-derived thin carbon fibers heated at 3000° C Carbon 42 (2004) 667-691.

Kim, P.; Shi, L.; Majumdar, A.; McEuen, P.L. Thermal Transport Measurements of Individual Multiwalled Nanotubes. Physical Review Letters. (Nov. 19, 2001). vol. 87, No. 21, 215502-1-4.

Ural, Ant; Li, Yiming; Dai, Hongjie. Electric-field-aligned growth of single-walled carbon nanotubes on surfaces. Applied Physics Letters 81, 18 Oct. 28, 2002.

Okabe, K.; Shiraishi, S.; Oya, A. Mechanism of heterogeneous graphitization observed in phenolic resin-derived thin carbon fibers heated at 3000° C Carbon 42 (2004) 667-691.

* cited by examiner

Table 1. Thermal performance of different TIM devices in the literature

| TIM device | Authors | Pressure (MPa) | Thermal resistance (mm² K/W) |
|---|---|---|---|
| Aligned carbon nanotube composite film | Huang et al. | 3 | 100–450 |
| CNT by PECVD | Xu and Fisher | 0.16 | 100 |
|  |  | 0.445 | 23 |
| Aligned CNTs by CVD | Zhang et al. | 0.1 | 15 |
| Aligned CNTs on double-sided copper foil | This study | 0.3 | 12 |

FIG. 9

SYNTHESIS OF ALIGNED CARBON NANOTUBES ON DOUBLE-SIDED METALLIC SUBSTRATE BY CHEMICAL VAPOR DEPOSITON

This application claims priority to provisional application Ser. No. 60/847,597, filed on Sep. 28, 2006 and which is incorporated herein by reference.

FIELD OF THE INVENTION

The present inventive subject matter relates to a method of synthesis of an aligned carbon nanotube (CNT) multilayer composite on both sides of a metallic substrate through catalytic pyrolysis of hydrocarbon in the presence of water. More particularly, the inventive subject matter relates to controlling the thickness of the CNTs on both sides of the metallic substrate by varying the operating parameters.

BACKGROUND OF THE INVENTION

With the continually diminishing size of electronic devices, the heat generated by such devices can cause structural damage due to over-heating. It is highly desirable to design and fabricate thermal interface materials (TIMs) with exceptionally high thermal conductivity for transporting heat efficiently from electronic components to a heat sink.

One such thermal interface material is a carbon nanotube (CNT), which has shown unique and attractive mechanical, electrical, and thermal properties. Several studies have revealed that CNTs have unusually high thermal conductivity in their axial direction. For example, molecular dynamic simulations of a single-walled nanotube (SWCNT) indicated that the thermal conductivity of the SWCNT can be as high as 6600 $Wm^{-1}K^{-1}$ at room temperature. See "Unusually High Thermal Conductivity Of Carbon Nanotubes" by Berber et al. "Thermal Transport Measurements of Individual Multi-walled Nanotubes", Kim et al., *Phys Rev. Lett.*, 87, 215502-1, 2001 disclosed measuring the thermal conductivity of a single multi-walled carbon nanotube (MWCNT) using a micro-fabricated suspended device, and their measurement showed that the thermal conductivity was larger than 3000 $Wm^{-1}K^{-1}$ at room temperature. Realizing that CNTs are good TIM candidates, efforts have been made on the use of dispersed CNTs as thermal conducting fillers in polymer composites. For example, "Thermal Conductivity Improvement of Silicone Elastomer with Carbon Nanotube Loading," Liu et al., *Appl Phys Lett.*, 84, 4248, 2004 reported a thermal conductivity ranging from 1.1 to 1.9 $Wm^{-1}K^{-1}$ as the CNT loading in a polymer composite increased from nil to 3.8 wt %. The below-expectation enhancement could be attributed to the random orientation of CNTs in the polymer matrix and the existence of interface thermal resistances between the actual heat source/sink and the TIM device. To avoid these problems, Huang et al. disclosed in "Aligned Carbon Nanotube Composite Films for Thermal Management" *Adv. Mater.*, 17, 1652, 2005 growing aligned CNTs on a silicon substrate and then fabricated a polymer composite film with such protruded, aligned CNTs running from one side of the TIM device to the other. An enhancement in thermal conductivity from 0.56 $Wm^{-1}K^{-1}$ for the pure elastomer matrix to 1.21 $Wm^{-1}K^{-1}$ for the same polymer embedded with a 0.4 vol % aligned CNT array was obtained. Despite the fact that aligned CNTs should have formed ideal thermal conducting paths through the composite structure, this enhancement was still far below expectation.

Various techniques have been developed for growth of aligned CNTs in well-aligned configurations, including plasma or laser enhanced chemical vapor deposition (hereinafter referred to as "CVD") process by Vander et al., *J. Phys. Chem. B.*, 106, 13122, 2002, hydrocarbon-ferrocene/ferric carbonyl mixture by Srivastava et al., *Carbon*, 39, 201, 2001 and also by Lee et al., *Appl Phys Lett.*, 82, 448, 2003 and CVD of hydrocarbon on metal thin films by Ant et al., *Appl Phys Lett.*, 81, 3464, 2002 and also by Merchan et al., *Carbon*, 42, 599; 2004 or pattern printing catalysts by Lee et al., *Letters to the Editor/Carbon*, 42, 667, 2004 on substrates.

There remains a need for a method of synthesizing an aligned carbon nanotube multilayer composite on both sides of a metallic substrate.

SUMMARY OF THE INVENTION

In the present inventive subject matter, the use of aligned CNTs as TIM was further explored in order to take advantage of the exceptional thermal conductivity of CNTs. Instead of growing the CNTs on silicon, they were grown on a metal surface by water vapor-assisted CVD.

The present invention provides a powerful method for producing aligned carbon nanotubes on double-sided metallic substrate through catalytic pyrolysis of hydrocarbon in the presence of water. The present inventive subject matter provides a design with two layers of aligned CNTs, which grow in two opposite directions (up and down) from a suspended metal layer with bottom and top surfaces exposed. The nanotubes with any desired diameter in the range of about 10~100 nm and lengths up to about 200 μm, are generated by the pyrolysis of a suitable hydrocarbon on double-sided metallic substrate.

The method comprises sputtering a thin layer of Cr and Au on both sides of metal foil as substrate. The method includes synthesizing aligned carbon nanotubes on both sides of substrate through catalytic pyrolysis of a suitable hydrocarbon gas at an appropriate temperature in the presence of water.

BRIEF DESCRIPTION OF THE DRAWINGS

The process of growth of aligned carbon nanotubes on double-sided metallic substrate will now be described with reference made to the accompanying drawings, in which:

FIG. 9 shows TABLE 1 presenting thermal performance of different TIM devices in the literature.

DETAILED DESCRIPTION OF THE INVENTION

Figure 1:
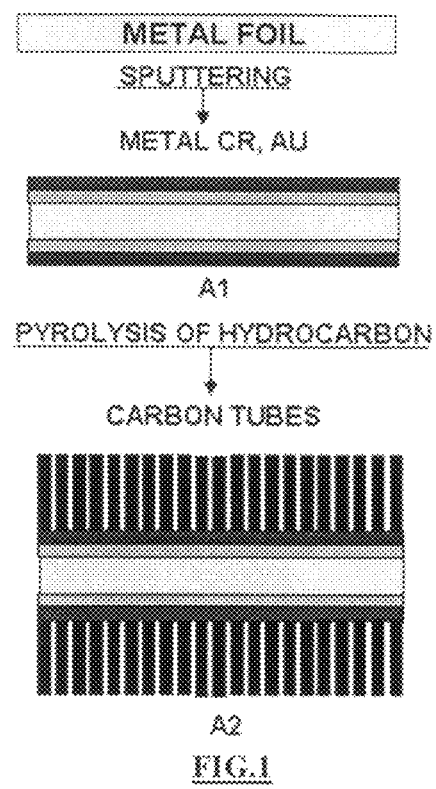
FIG. 1 is a schematic diagram showing the steps of synthesizing aligned carbon nanotubes with the present inventive subject matter.

The process of synthesizing aligned carbon nanotubes on double-sided metallic substrate 2 is shown schematically in FIG. 1. The proposed multilayer composite structure 4 has two films of aligned CNTs 6a and 6b grown on the opposite faces of a suspended substrate 2. Provided that the substrate is sufficiently thin and highly conductive, this double-sided design for a TIM device has the distinct advantage that it can fit between the heat source and heat sink to minimize the resistance to heat flow due to the presence of an air gap. Two kinds of substrates were chosen in the experiments. One was an electrically conductive material, for example metal plate or metal foil; the other was an electrically insulating material, for example silicon wafer. Whether the material selected for the substrate was electrically conducting or electrically insulating depended on the desired application for the thermal interface device. Different metals including silver, copper, and gold were used as substrates. Gold was found to be the best substrate for growth of aligned CNTs. However, copper is much cheaper and has a higher thermal conductivity (388 $Wm^{-1}K^{-1}$) than that of gold (315 $Wm^{-1}K^{-1}$). For these reasons, a thin film of gold was sputtered on the surface of the copper substrate. It is known that the adhesion of gold on copper is not sufficiently strong. By trial and error, it was found that good adhesion could be achieved with chromium 8 between gold 10 and copper. Thus, chromium films of thickness 12 nm and gold films of thickness 20 nm were deposited on both sides of three substrates—silicon wafer, copper plate and copper foil using an ARC-12M sputtering machine.

CVD synthesis of aligned CNTs was performed in a horizontal quartz tube (2.5 cm in diameter and 70 cm in length) housed in a single-zone furnace (Carbolite, UK). A quartz boat (2.2 cm wide and 10 cm long) was placed in the middle of the quartz tube, where the temperature was the highest along the tube length. The substrates were placed in the middle of the boat except otherwise specified. Ferrocene, with a decomposition temperature of about 190° C., was stationed at the inlet of the quartz tube. Each reaction run started with the CVD reactor at room temperature. A specified amount of double deionized (DDI) water was injected using a micro-syringe under the quartz boat holding the ferrocene. Then, flow of argon was initiated while heating up the CVD reactor. Typically 20 minutes was required to reach the desirable reactor temperature and at that point, ethylene and hydrogen were introduced. CVD growth of aligned CNTs was carried out at about 725~800° C. with the flow rates of ethylene, hydrogen and argon set at 40, 16 and 200 sccm, respectively. The temperature at the inlet of the quartz tube was about 200° C. in a typical reaction run. The flow of ethylene/hydrogen/argon mixture was maintained for the entire growth period ranging from about 10 to 60 min. After the reaction, the furnace was allowed to cool down to room temperature while maintaining the flow of argon.

In addition, operating factors that can significantly influence the growth of CNTs on such a double-sided metal substrate were investigated in detail. The following examples are illustrative of an embodiment of the present inventive subject matter and, thus, are not intended to limit the scope of the present inventive subject matter.

Example 1

Aligned CNTs were produced by using a chemical vapor deposition system, which included a horizontal quartz tube (2.5 cm diameter; 70 cm long) housed in a sing-zone furnace (Carbolite, UK). The substrate was placed in the middle of the heating zone, which had the maximum temperature of 750° C. The following conditions were used in experiments where a different volume of water was added into the reaction system:

Substrate: Thin Cr film (12 nm) and Au film (20 nm) were deposited on both sides of the silicon wafer.

Volume of water added: 0 mL, 0.2 mL, 0.3 mL, 0.4 mL, 0.6 mL

Amount of catalyst: 150 mg ferrocene

Growth temperature: 750° C.

Growth time: 20 min

Flow rate of argon: 200 sccm

Flow rate of hydrogen: 16 sccm

Flow rate of ethylene: 40 sccm

Figure 2:
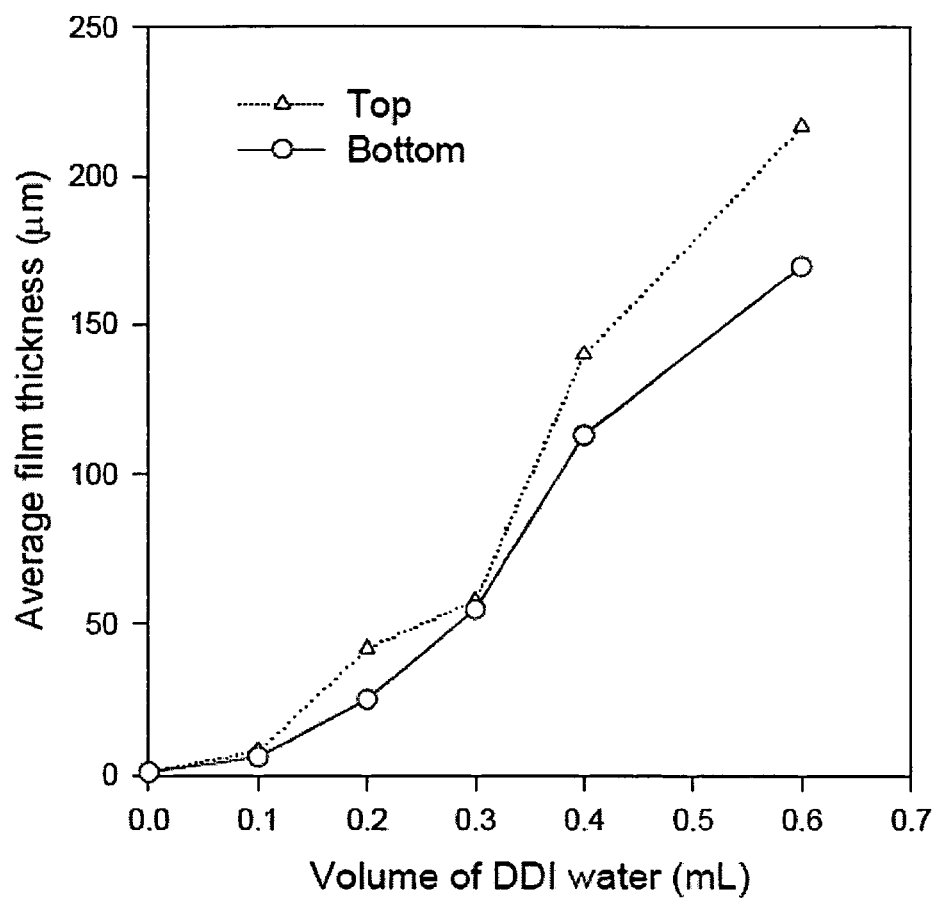
FIG. 2 represents the relationship between the thickness of CNTs film and volume of water.

Under the above conditions, different thicknesses of CNT films were synthesized on double-sided metallic substrate. The relationship between the thickness of CNT film and the volume of water is shown in FIG. 2. It is seen that much longer and denser aligned CNT's are obtained with the injection of water.

Example 2

The following conditions were used in experiments where different growth temperatures were chosen:

Substrate: Thin Cr film (12 nm) and Au film (20 nm) were deposited on both sides of the silicon wafer.

Volume of water added: 0.4 mL

Amount of catalyst: 150 mg ferrocene

Growth temperature: 725° C., 750° C., 775° C., 800° C.

Growth time: 20 min

Flow rate of argon: 200 sccm

Flow rate of hydrogen: 16 sccm

Flow rate of ethylene: 40 sccm

Figure 3:
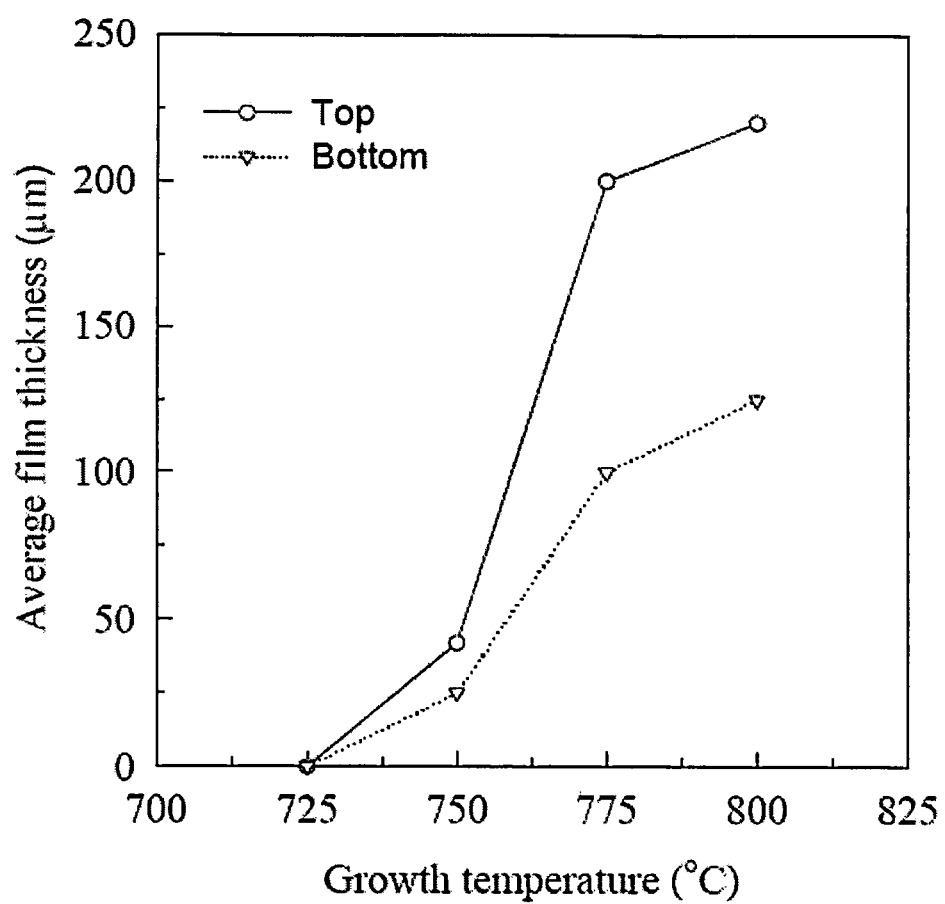
FIG. 3 represents the relationship between the thickness of CNTs film and growth temperature.

Under the above conditions, different thicknesses of CNT films were synthesized on double-sided metallic substrate. The relationship between the thickness of CNT film and growth temperature is shown in FIG. 3. It is seen that a thicker aligned CNT film can be synthesized by higher temperature. Temperature is a factor for aligned CNT synthesis, the thickness of CNT film can be controlled by varying CVD growth temperature.

Example 3

The following conditions were used in experiments where different amounts of ferrocene were chosen as catalyst:

Substrate: Thin Cr film (12 nm) and Au film (20 nm) were deposited on both sides of the silicon wafer.

Volume of water added: 0.4 mL

Amount of catalyst: 30 mg, 100 mg, 150 mg, 200 mg ferrocene

Growth temperature: 750° C.

Growth time: 20 min

Flow rate of argon: 200 sccm

Flow rate of hydrogen: 16 sccm

Flow rate of ethylene: 40 sccm

Figure 4:
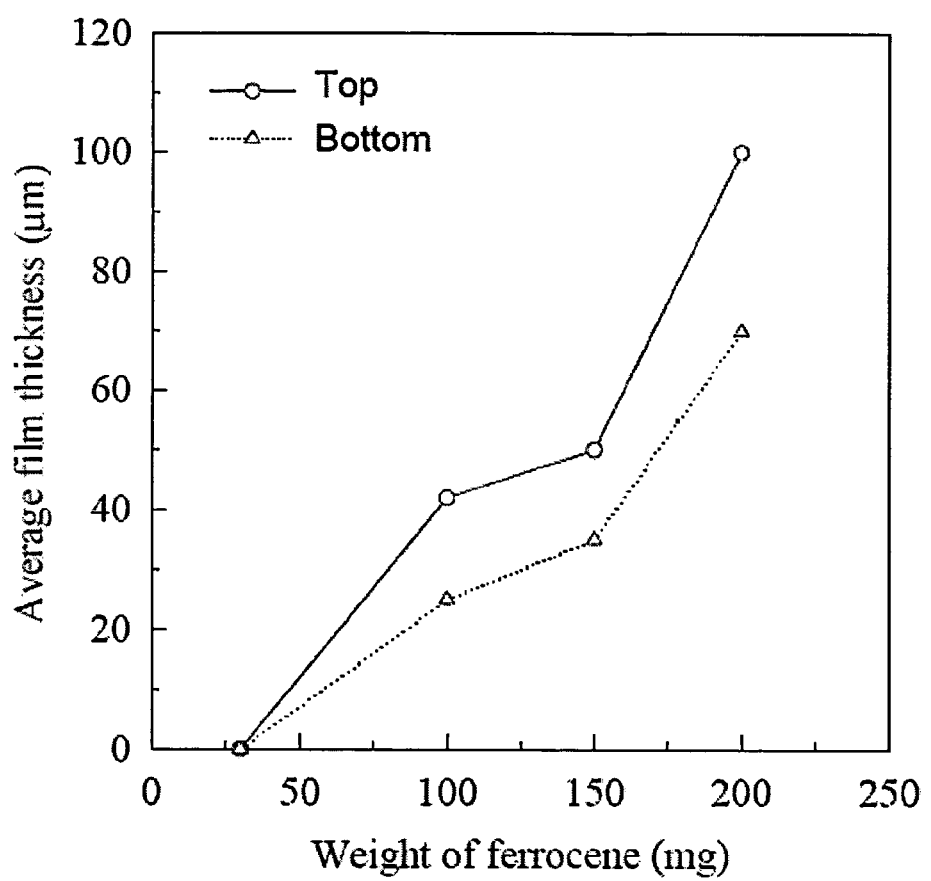
FIG. 4 represents the relationship between the thickness of CNTs film and amounts of ferrocene.

Under the above conditions, different thicknesses of CNT films were synthesized on double-sided metallic substrate. The relationship between the thickness of CNT film and amounts of ferrocene is shown in FIG. 4. Thicker CNT film can be synthesized by larger amounts of ferrocene. The amounts of ferrocene are another important factor for aligned CNTs synthesis, the thickness of CNTs film can be controlled by varying the amount of the catalyst.

Example 4

Figure 5:
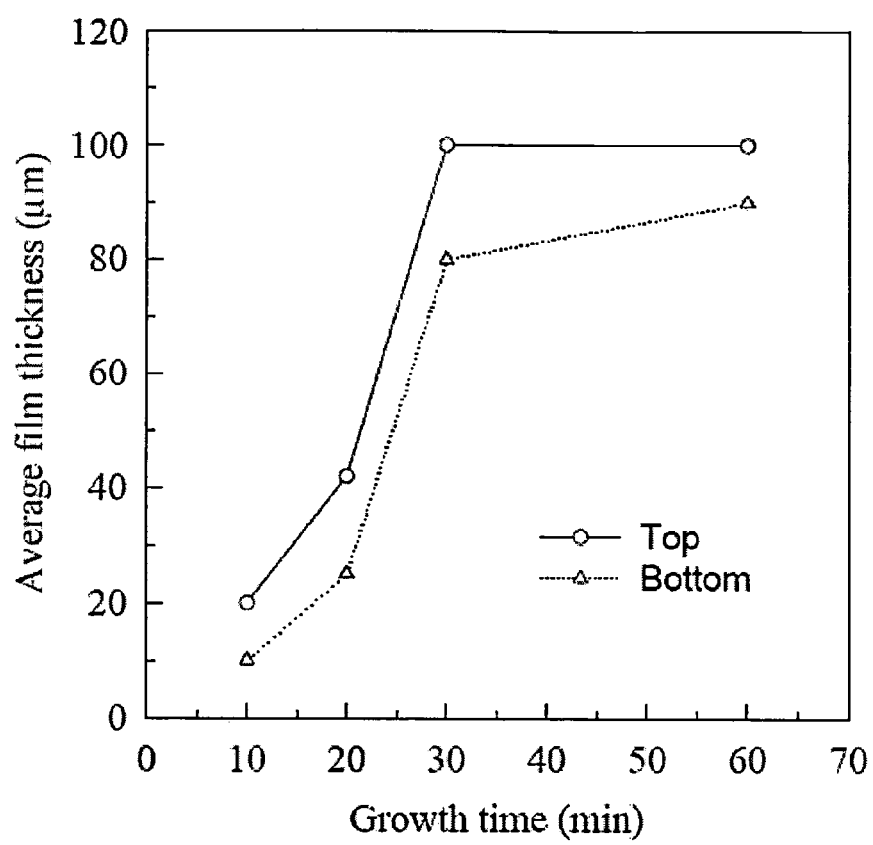
FIG. 5 represents the relationship between the thickness of CNT film and growth time.

The following conditions were used in experiments where different growth time was chosen for synthesis:
Substrate: Thin Cr film (12 nm) and Au film (20 nm) were deposited on both sides of the silicon wafer.
Volume of water added: 0.4 mL
Amount of catalyst: 150 mg ferrocene
Growth temperature: 750° C.
Growth time: 10 min, 20 min, 30 min, 60 min
Flow rate of argon: 200 sccm
Flow rate of hydrogen: 16 sccm
Flow rate of ethylene: 40 sccm Under the above conditions, different thicknesses of CNT films were synthesized on double-sided metallic substrate. The relationship between the thickness of CNT film and the growth time is shown in FIG. 5. FIG. 5 shows that the rate of growth is gradually reduced as the growth time is increased. No remarkable change of thickness of CNT film on both sides of the substrate when the growth time is increased from 30 min to 60 min. This clearly indicates that CNT films grow rapidly up to about 30 min and growth almost terminates after 30 min. The decreased growth rate could be attributed to the fixed amount of ferrocene in the reaction system.

Example 5

Figure 6A:
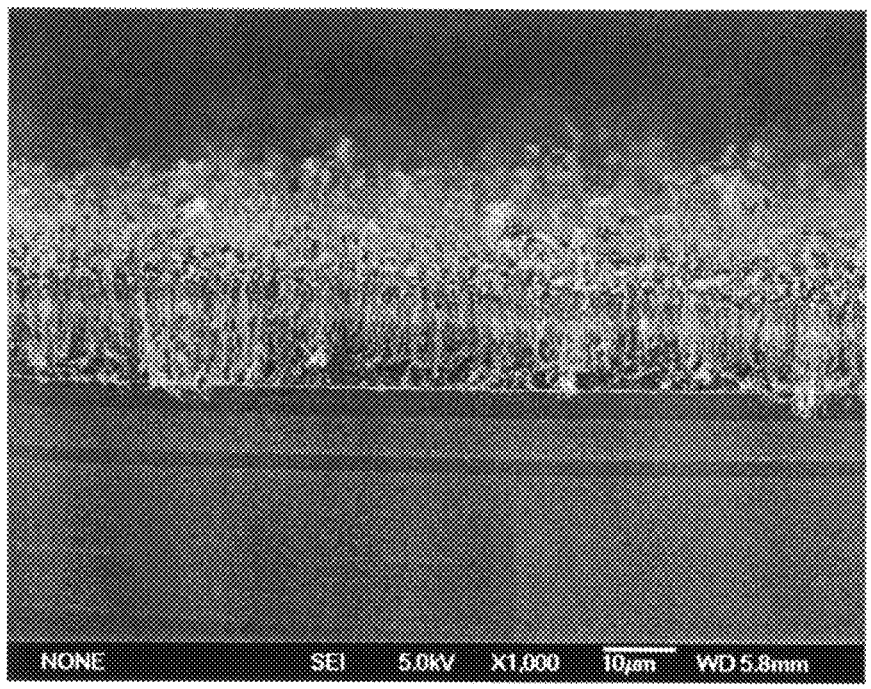
FIGS. 6a and 6b show scanning electron micrograph (SEM) images of aligned carbon nanotubes grown on top and bottom of metallic substrate by pyrolysis, respectively.
Figure 6B:
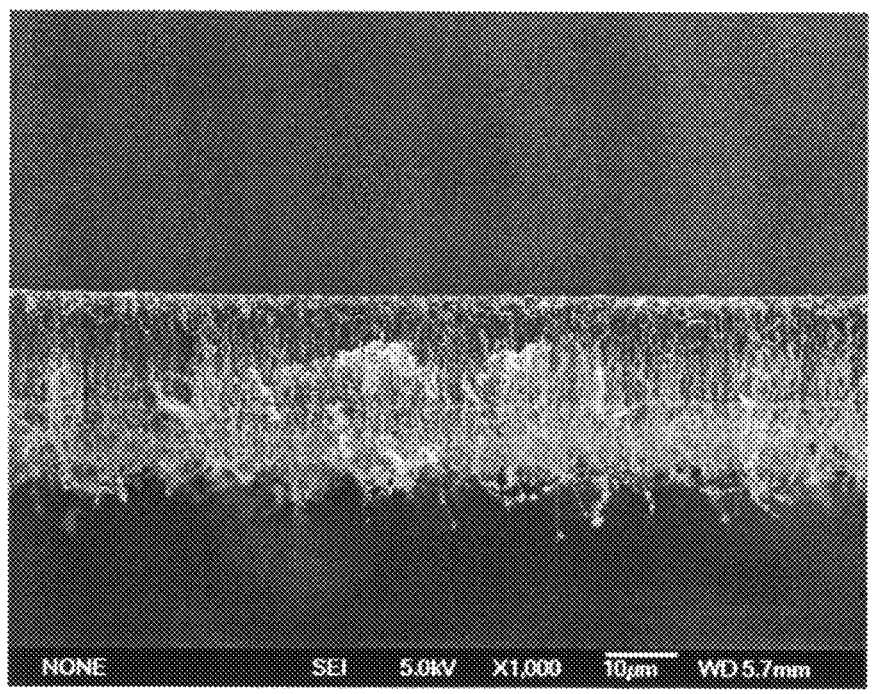

On the basis of the optimization experiments, the thickness of CNT films on double-sided substrate can be controlled by varying the operating parameters. The following conditions were used in experiments for synthesis:
Substrate: Thin Cr film (12 nm) and Au film (20 nm) were deposited on both sides of the silicon wafer (400 μm thickness), copper plate (0.5 inch diameter; 0.3 mm thickness) and copper foil (2 cm wide; 4 cm long; 0.007 mm thickness) respectively
Volume of water added: 0.4 mL
Amount of catalyst: 150 mg ferrocene
Growth temperature: 750° C.
Growth time: 20 min
Flow rate of argon: 200 sccm
Flow rate of hydrogen: 16 sccm
Flow rate of ethylene: 40 sccm Under the above conditions, aligned CNTs multilayer composites were produced. It was very difficult to characterize samples with a ductile substrate such as a thin metal plate or foil by scanning electron microscopy (SEM). Therefore, optimization of the operating factors was accomplished by using a silicon wafer as substrate. FIGS. 6a and 6b show SEM images of aligned carbon nanotubes grown on the top and bottom surfaces of a metallic silicon wafer substrate, respectively. The nanotubes are perpendicular to the substrate.

Figure 7A:
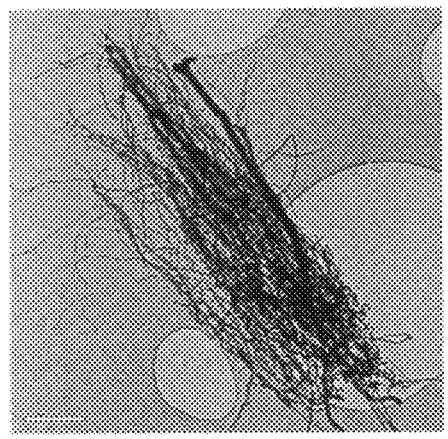
FIG. 7a shows a transmission electron micrograph (TEM) of a bundle of aligned carbon nanotubes.
Figure 7B:
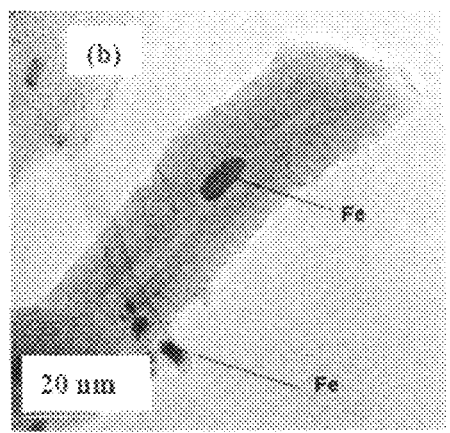
FIG. 7b shows a TEM image of a CNT with trapped Fe catalyst particles.
Figure 7C:
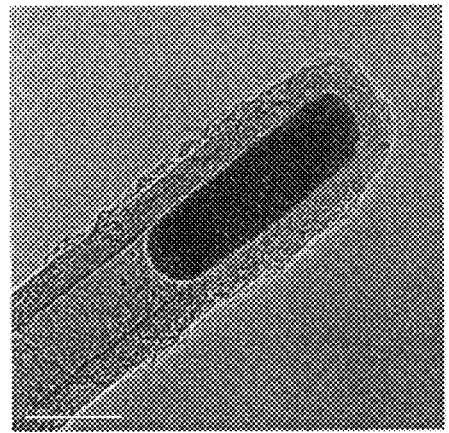
FIG. 7c shows a TEM image of a CNT with a metal particle at its tip.
Figure 7D:
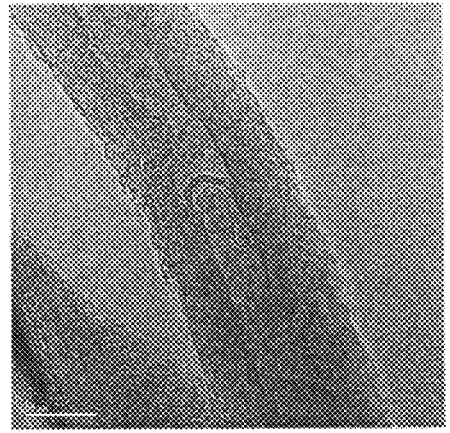
FIG. 7d shows a TEM image of a typical CNT with bamboo structure.

The detailed structure of the CNTs was studied by High Resolution Transmission Electron Microscopy ("HRTEM") (FIG. 3). As can be seen, the CNTs were of different sizes but had a similar structure. FIG. 7a shows a bundle of synthesized aligned CNTs, comprising mainly small carbon nanotubes. FIG. 7b shows a CNT with trapped Fe catalyst particles. Most of the CNTs had an end closed with a metal particle at the tip (FIG. 7c). FIG. 7d shows a particular nanotube with an inner and outer diameter of approximately 8 and 20 nm, respectively, and contained about 25 graphitic layers in each sidewall.

Figure 8A:
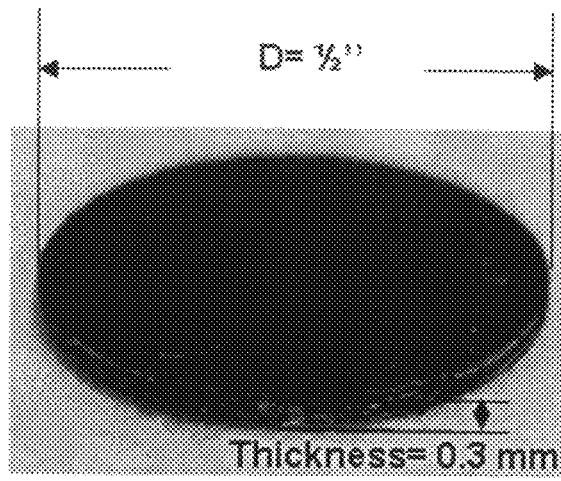
FIG. 8a shows photo of aligned carbon nanotubes grown on both sides of copper sheet (thickness: 0.3 mm)
Figure 8B:
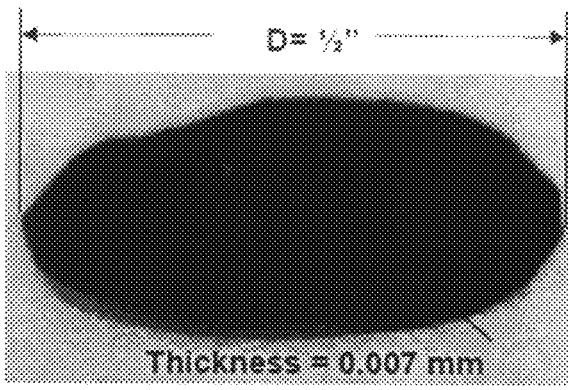
FIG. 8b shows photo of aligned carbon nanotubes grown on both sides of copper foil (thickness: 0.007 mm)
Figure 8C:
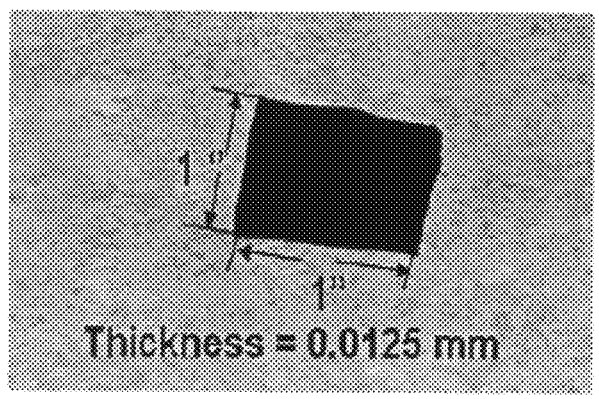
FIG. 8c shows photo of aligned carbon nanotubes grown on both sides of copper foil (thickness: 0.0125 mm)

Based on experiments on silicon substrate, the following conditions were used to synthesize 50 μm thick CNT films on both sides of a copper substrate sputtered with Cr and Au: volume of water injected: 0.3 mL, catalyst: 100 mg ferrocene, growth temperature: 750° C., growth time: 20 min. FIGS. 8a, 8b and 8c show the photographs of a copper sheet (0.5 inch diameter; 0.3 mm thickness); a copper foil (0.5 inch diameter, 0.007 mm thick); and a copper film (1 inch by 1 inch, 0.0125 mm thick) with aligned CNTs grown on both sides, respectively.

The present method is highly advantageous over prior art methods of growing aligned CNTs since the thickness of CNT films on both sides of a metallic substrate can be controlled by varying different operating parameters. With the presence of water, the thickness of CNT film can be controlled from 2 μm to 200 μm. It is very important to control the density, length, and alignment of CNTs for thermal interface devices.

In the present design of an aligned CNT multilayer composite, it is not necessary to strip off the substrate from the CNT film. Thus, a self-supporting thin film, which can provide great practical and potential commercial value, can be finally obtained.

The thermal resistance of the TIM device with the metal substrate was evaluated using a steady state measurement system which was designed in accordance with ASTM D5470. The thermal resistance of the 12.5 μm copper foil (or a total TIM device thickness of 112.5 μm) was determined to be 12 mm$^2$ K/W under an applied contact pressure of 0.3 MPa. This is lower than those reported in the literature (Table 1). For example, the thermal resistance of the aligned CNT composite film synthesized by Huang et al. *Adv. Mater.*, 17, 1652, 2005 ranged from 100 to 450 mm K/W as the sample thickness increased from 100 to 500 μm. The thermal resistance of the CNT film synthesized by Xu et al. "Proc 9$^{th}$ Intersociety Conference On Thermal And Thermomechanical Phenomena In Electronic Systems, Las Vegas, Nev. New York," IEEE, 549, 2004 using plasma enhanced CVD was 100 mm$^2$ K/W under a contact pressure of 0.16 MPa and 23 mm$^2$ K/W under 0.445 MPa. Results are comparable to those of Zhang et al., who reported a thermal resistance of 15 mm$^2$ K/W with a film thickness ranging from 30 to 70 μm.

The foregoing description of the preferred embodiments of the process for producing aligned CNTs has been presented to illustrate the principles of the invention and not to limit the invention to the particular embodiments disclosed. It is intended that the scope of the invention be defined by all the embodiments encompassed within the following claims and their equivalents.

We claim:
1. A process for synthesis of aligned carbon nanotubes, comprising:
sputtering a thin layer of chromium and gold on a first and a second side of a double-sided substrate;
synthesizing aligned carbon nanotubes on first and second sides of said metallic double sided substrate by applying catalytic pyrolysis of a hydrocarbon gas in the presence of a catalyst comprising ferrocene at about 725° C.~800° C. with the presence of water in a chemical vapor deposition (CVD) process.

2. The process for synthesis of aligned carbon nanotubes according to claim 1 wherein the thickness of the layer of chromium ranges from about 10 nm to about 20 nm.

3. The process for synthesis of aligned carbon nanotubes according to claim 1 wherein the thickness of the layer of gold ranges from 10 nm to 100 nm.

4. The process for synthesis of aligned carbon nanotubes according to claim 1 wherein the substrate is comprised of an electrically conductive material or an electrically insulating material.

5. The process for synthesis of aligned carbon nanotubes according to claim 4 wherein said electrically conductive material comprises a metal plate or metal foil.

6. The process for synthesis of aligned carbon nanotubes according to claim 4 wherein said electrically insulating material comprises a silicon wafer.

7. The process for synthesis of aligned carbon nanotubes according to claim 1 wherein the amount of ferrocene ranges from 30 mg to 200 mg.

8. The process for synthesis of aligned carbon nanotubes according to claim 1 wherein process is conducted in a chamber having a quartz tube providing access to said chamber and wherein said ferrocene is stationed at an inlet of said quartz tube wherein a temperature at said inlet is 150° C.~200° C.

9. The process for synthesis of aligned carbon nanotubes according to claim 1 wherein the hydrocarbon gas comprises ethylene.

10. The process for synthesis of aligned carbon nanotubes according to claim 9 wherein a flow rate of the hydrocarbon gas ranges from 10 sccm to 100 sccm.

11. The process for synthesis of aligned carbon nanotubes according to claim 9 wherein time to perform the process for the entire growth period ranging from about 10 to 60 min.

12. The process for synthesis of aligned carbon nanotubes according to claim 1 wherein the hydrocarbon gas comprises acetylene.

13. The process for synthesis of aligned carbon nanotubes according to claim 12 wherein process is conducted in a chamber having a quartz tube providing access to said chamber and wherein the volume of water vapor in the CVD chamber is controlled by injecting de-ionized water into the quartz tube.

14. The process for synthesis of aligned carbon nanotubes according to claim 13 wherein water is injected into said chamber at an inlet of said quartz tube.

15. The process for synthesis of aligned carbon nanotubes according to claim 13 wherein said volume of water ranges from 0.1 mL to 1 mL.

16. The process for synthesis of aligned carbon nanotubes according to claim 1 wherein the hydrocarbon gas comprises ethane.

17. The process for synthesis of aligned carbon nanotubes according to claim 16 wherein the flow rate of the hydrocarbon range from 10 sccm to 1000 sccm.

18. The process for synthesis of aligned carbon nanotubes according to claim 16 wherein time to perform the process for the entire growth period ranging from about 10 to 60 min.

19. The process for synthesis of aligned carbon nanotubes according to claim 1 wherein a carrying gas is argon.

20. The process for synthesis of aligned carbon nanotubes according to claim 19 wherein a flow rate of the carrying gas is 100 sccm to 300 sccm.

21. The process for synthesis of aligned carbon nanotubes according to claim 12 wherein a flow rate of the hydrocarbon range from 10 sccm to 1000 sccm.

22. The process for synthesis of aligned carbon nanotubes according to claim 12 wherein time to perform the process for the entire growth period ranging from about 10 to 60 min.

23. The process for synthesis of aligned carbon nanotubes according to claim 1 further comprising introducing hydrogen to the substrate during the CVD process.

24. The process for synthesis of aligned carbon nanotubes according to claim 1 wherein said hydrocarbon gas is pyrolyzed at a temperature ranging from 725° C. to 800° C.

25. The process for synthesis of aligned carbon nanotubes according to claim 1 wherein a ramping rate of the chemical vapor deposition furnace temperature is 40~45° C./min.

\* \* \* \* \*

UNITED STATES PATENT AND TRADEMARK OFFICE
CERTIFICATE OF CORRECTION

| | | |
|---|---|---|
| PATENT NO. | : 8,617,650 B2 | Page 1 of 1 |
| APPLICATION NO. | : 11/905241 | |
| DATED | : December 31, 2013 | |
| INVENTOR(S) | : Wang et al. | |

It is certified that error appears in the above-identified patent and that said Letters Patent is hereby corrected as shown below:

Title Page, item [54] and in the Specification, column 1, delete the last word in the current title, shown as "DEPOSITON", and replace with DEPOSITION, so the title reads as SYNTHESIS OF ALIGNED CARBON NANOTUBES ON DOUBLE-SIDED METALLIC SUBSTRATE BY CHEMICAL VAPOR DEPOSITION.

Signed and Sealed this
Twenty-ninth Day of April, 2014

Michelle K. Lee
*Deputy Director of the United States Patent and Trademark Office*